US006208142B1

(12) United States Patent
Wagshul (10) Patent No.: US 6,208,142 B1
(45) Date of Patent: Mar. 27, 2001

(54) MAGNETIC RESONANCE APPARATUS AND METHODS WITH SHIM ADJUSTMENT

(75) Inventor: Mark Wagshul, Patchogue, NY (US)

(73) Assignee: Transurgical, Inc., Setauket, NY (US)

( * ) Notice: Subject to any disclaimer, the term of this patent is extended or adjusted under 35 U.S.C. 154(b) by 0 days.

(21) Appl. No.: 09/206,443

(22) Filed: Dec. 7, 1998

(51) Int. Cl.[7] .............................. G01R 33/20; G01V 3/00
(52) U.S. Cl. .......................................... 324/319; 324/309
(58) Field of Search .................................. 324/300, 309, 324/307, 368, 322, 319

(56) References Cited

U.S. PATENT DOCUMENTS

| | | | |
|---|---|---|---|
| 3,256,464 | 6/1966 | Stauffer | 317/9 |
| 3,394,330 | 7/1968 | Schindler | 335/216 |
| 3,406,333 | 10/1968 | Nelson | 324/5 |
| 3,932,805 | * 1/1976 | Abe et al. | 324/309 |
| 4,038,622 | 7/1977 | Purcell | 335/216 |
| 4,456,881 | 6/1984 | Compton | 324/319 |
| 4,587,504 | 5/1986 | Brown et al. | 335/216 |
| 4,623,864 | 11/1986 | Inoue et al. | 335/299 |
| 4,701,736 | 10/1987 | McDougall et al. | 335/299 |
| 4,721,914 | 1/1988 | Fukushima et al. | 324/320 |
| 4,875,485 | 10/1989 | Matsutani | 128/653 |
| 5,270,657 | 12/1993 | Wirth et al. | 324/322 |
| 5,331,282 | 7/1994 | McDougall et al. | 324/319 |
| 5,365,172 | * 11/1994 | Hrovat et al. | 324/309 |
| 5,382,904 | 1/1995 | Pissanetzky | 324/319 |
| 5,525,904 | * 6/1996 | Hanly et al. | 324/300 |
| 5,977,771 | 11/1999 | Petropoulos | 231/318 |

FOREIGN PATENT DOCUMENTS

| | | |
|---|---|---|
| 0 186998 B1 | 11/1989 | (EP). |
| WO98/52465 | * 11/1998 | (WO). |

* cited by examiner

Primary Examiner—Christine K. Oda
Assistant Examiner—Tiffany A. Fetzner
(74) Attorney, Agent, or Firm—Lerner, David, Littenberg, Krumholz & Mentlik, LLP (57) ABSTRACT

A magnet for magnetic resonance imaging of the type arranged to provide fields suitable for imaging in an imaging region outside of the physical structure of the magnet, such as a magnet including plural concentric superconducting coils, generates a field having near-zero radial curvature at one location. Shim coils are actuated to adjust this location in synchronism with tuning of the RF transceiver for slice selection, so that when each slice is selected, that slice is coincident with the location of near-zero radial curvature.

17 Claims, 3 Drawing Sheets

MAGNETIC RESONANCE APPARATUS AND METHODS WITH SHIM ADJUSTMENT

FIELD OF THE INVENTION

The present invention relates to magnetic resonance imaging apparatus and methods.

BACKGROUND OF THE INTENTION

Magnetic resonance is used in medical imaging for diagnostic purposes. In magnetic resonance imaging procedures, the region of the subject to be imaged is subjected to a strong magnetic field. Radio frequency signals are applied to the tissues of the subject within the imaging volume. Under these conditions, atomic nuclei are excited by the applied radio frequency signals and emit faint radio frequency signals, referred to herein as magnetic resonance signals. By applying appropriate gradients in the magnetic field during the procedure, the magnetic resonance signals can be obtained selectively from a limited region such as a two-dimensional slice of the subject's tissue. The frequency and phase of the signals from different portions of the slice can be made to vary with position in the slice. Using known techniques, it is possible to deconvolute the signals arising from different portions of the slice and to deduce certain properties of the tissues at each point within the slice from the signals.

Magnetic resonance imaging instruments of the types commonly used for medical diagnostic applications include large, precise magnets which are arranged to impose a high magnetic field, typically about one Tesla or more over a relatively large imaging volume typically 10 cm or more in diameter. Certain magnetic resonance imaging static field magnets severely limit access to the subject. For example, a solenoidal air-core superconducting magnet may have superconductive coils surrounding a tubular subject-receiving space. The subject lies on a bed which is advanced into the said tubular space so that the portion of the patient to be imaged is disposed inside of the tubular space. Iron core magnets typically have ferromagnetic frames defining opposed poles and a subject-receiving space lying between the poles. Permanent magnets or electromagnets are associated with the frame for providing the required magnetic flux. Depending upon the design of the magnet, either the superconductive coils or the frame may obstruct access to the patient during operation of the magnetic resonance instrument. Moreover, because the magnetic resonance imaging instruments typically employed in medicine are expensive, fixed structures, there are substantial costs associated with occupancy of the instrument.

Copending, commonly assigned U.S. patent application Ser. No. 09/083,414, filed May 22,1998, and the corresponding International Application PCT/US98/10623, also filed May 22, 1998, the disclosures of which are hereby incorporated by reference herein, describe apparatus which incorporates magnetic resonance imaging capability in a relatively small device. Apparatus according to preferred embodiments disclosed in the copending applications includes a movable static field magnet adapted to apply a static magnetic field in a magnetic resonance volume at a predetermined disposition relative to the static field magnet, and may also include an energy applicator such as a high intensity focused ultrasound or "HIFU" device. The preferred apparatus according to the copending applications also includes positioning means for moving the static field magnet and the energy applicator to position the magnet and the applicator so that the magnetic resonance volume at least partially encompasses a region of the subject to be treated and so that the energy applicator is focused within the magnetic resonance volume. For example, the apparatus may include a chassis carrying both the static field magnet and the energy applicator, and the positioning means is arranged to move the chassis relative to the subject. The apparatus may further include ancillary equipment such as gradient coils mounted to the chassis or otherwise secured in position relative to the static field magnet for applying a magnetic field gradient within the magnetic resonance volume, as well as radio frequency equipment for applying radio frequency signals to the subject and receiving the resulting magnetic resonance signals. Apparatus of this type may be used to acquire images of small regions within the patient's body, and may also be used to perform therapeutic procedures such as thermal ablation of tumors or other undesired tissues. The therapeutic procedures can be monitored using the magnetic resonance apparatus.

As disclosed in the copending applications, the static field magnet desirably is a "single-sided" static field magnet. That is, the magnet is arranged so that the magnetic resonance volume where the field is suitable for imaging is disposed outside of the static field magnet and spaced from the static field magnet in a forward direction. Thus, the magnet can be placed alongside the patient, without placing the patient into the magnet. The static field magnet most preferably is substantially smaller than the static field magnets utilized in conventional magnetic resonance imaging instruments. For example, the static field magnet may have dimensions of a meter or less and may be light enough to be moved readily by a positioning device of reasonable cost and proportions. Thus, the entire apparatus can be moved as required to position it adjacent to the region of the subject's body which requires treatment. The most preferred apparatus according to these embodiments is small enough and inexpensive enough to be used in a clinical setting such as a physician's office or medical center. Thus, it is feasible to perform magnetic resonance-monitored energy applying procedures in a normal clinical setting. There is no need to occupy an expensive diagnostic magnetic resonance imaging instrument during such procedures.

The copending applications disclose improved single-sided static-field magnets for magnetic resonance. For example, the static field magnet may include a set of concentric superconducting coils mounted in a cylindrical cryostat. The dimensions of the coils, as well as the current flows in the coils, are selected to provide a relatively small linear field gradient $$\frac{dB}{dZ},$$

i.e., a relatively small, linear variation of field magnitude B with distance in the axial or Z direction of the coils, within a region spaced forwardly from the coils in the axial direction . In this same region, the radial field curvature $$\frac{d^2B}{dX^2}$$

is also relatively small and hence the field gradient in radial or X directions transverse to the axial direction of the coils is also relatively small. For example, the magnet may provides a field with a linear axial gradient and with very small radial gradients over a region having an axial extent of about 1 cm and having a diameter of about 3 cm, this region being centered on a central point about 20–30 cm forward of the coils. The magnet may be used to acquire images within this region. Because the static field magnet imposes a field gradient in the axial or Z direction, the magnetic resonance frequencies of nuclei vary with location in the axial or Z direction. Different two-dimensional sections or "slices" can be selected by tuning the RF apparatus to the magnetic resonance frequency associated with each axial location.

However, these slices are not perfectly flat. Because the field has some curvature in radial directions, a slice or surface of constant field magnitude is actually in the form of a shallow surface of revolution or bowl-shape coaxial with the axis of the magnet. Displaying the image of such a slice as a planar image, or treating the magnetic resonance data as a data defining a planar slice, introduces some inaccuracy into the system. Moreover, the degree of deviation from perfect flatness varies with the axial location of the slice. Slices which intercept the axis close to a particular location on the axis referred to as the "sweet spot" are quite flat, whereas slices which intercept the axis at an appreciable distance from the sweet spot are curved to a greater degree. Although the magnets disclosed in the copending applications provide useful imaging and monitoring despite these effects, it would be desirable to reduce or eliminate these effects.

SUMMARY OF THE INVENTION

One aspect of the present invention provides a magnet for magnetic resonance studies including magnet resonance imaging. Preferably, a magnet in accordance with this aspect of the invention includes a plurality of main field coils arranged to provide an axially symmetric magnetic field such that a slice or surface of constant field magnitude most closely approximates a preselected shape at a preselected axial location or "sweet spot" along the axis when the main field coils are energized with predetermined current flows. Most preferably, the main field coils are arranged to provide a field having a radial curvature or second derivative of field magnitude in the radial direction perpendicular to the axis which is at a minimum at the preselected axial location or "sweet spot" along the axis when the main field coils are energized with the predetermined current flows, and hence a surface of constant field magnitude at the sweet spot most closely approximates a plane perpendicular to the axis. Preferably, the main field coils are arranged in a "single sided" design so that the sweet spot is outside of the axial region encompassed by the coils.

A magnet according to this aspect of the invention desirably includes one or more shim coils and shim coil drivers associated with the shim coils. The configuration of the shim coils and the currents applied by the shim coil drivers are selected so that currents passing through the shim coils will add an additional magnetic field. This additional magnetic field, referred to herein as the "shim field" moves the sweet spot axially. That is, the resultant field produced by superposition of the shim field and the main field has a slice or surface of constant field magnitude which most closely approximates the preselected shape at a sweet spot or location along the axis different from the axial location of the sweet spot of the main field alone. In the preferred arrangement where the field at the sweet spot has a minimum radial curvature and hence the slice at the sweet spot most closely approximates a plane, the resultant field produced by superposition of the shim field and the main field has the minimum radial curvature at a location along the axis different from the location of minimum radial curvature of the main field alone.

Preferably, the shim coils are axially symmetric and coaxial with the main field coils. Desirably, the shim coils and the currents applied by the shim coil drivers are arranged to produce a field having radial curvature which is opposite to the radial curvature of the main field in the region surrounding the sweet spot of the main field coils. In one particularly preferred embodiment, the shim coils are mirror symmetric with the main field coils about a plane of symmetry perpendicular to the axis. That is, for each main field coil there is a corresponding shim coil having the same mean radius. Each main field coil and the corresponding shim coil are disposed at equal but opposite distances from the plane of symmetry. In this arrangement, each shim coil desirably is energized with a current in the opposite sense from the current carried by the corresponding main field coil.

Typically, the main field coils carry substantially constant currents; these main field coils normally are superconducting coils, housed in a cryostat. The shim coils typically have far smaller numbers of ampere-turns than the main field coils. Desirably, the shim coils are resistive coils, and are driven by a variable-current power supply so that the currents carried by the shim coils can be varied during operation. By varying the currents carried in the shim coils, the sweet spot of the resultant field is moved axially. Preferably, this axial movement of the sweet spot is coordinated with slice selection so that the sweet spot is aligned with the selected slice. Thus, magnetic resonance data from each selected slice is taken using a field having minimum radial field curvature, and an axial location corresponding to the axial intercept of the slice. This substantially eliminates the effect of differing field curvature discussed above. Every slice represents a substantially flat region of the subject perpendicular to the axis.

Apparatus according to this aspect of the invention may further include ancillary equipment such as gradient coils for applying magnetic field gradients within the magnetic resonance volume, as well as radio frequency equipment for applying radio frequency signals to the subject and receiving the resulting magnetic resonance signals. The apparatus may further include a computer for processing the magnetic resonance signals so as to derive an image of tissues of the subject within the magnetic resonance region, or to derive other data about the subject such as temperature measurements for one or more volume elements within the subject. The static field magnet in apparatus according to this aspect of the invention may be mounted on a positioning system for moving the static field magnet relative to the patient. Apparatus according to this aspect of the invention may be incorporated into therapeutic apparatus according to the aforementioned commonly assigned applications. The system may include a HIFU unit or other energy-applying device as discussed in those applications.

Further aspects of the present invention provide methods of magnetic resonance examination such as magnetic resonance imaging. Methods according to this aspect of the present invention desirably include the steps of actuating a set of main field coils and a set of shim coils so that the fields from the coils superposed on one another sum to an axially-symmetric resultant field having an axial gradient and also having radial field curvature, such that the resultant field has slices of constant field magnitude which most closely approximate a preselected shape at a preselected axial location or "sweet spot". Preferably, the radial field curvature of the resultant field is at a minimum at preselected axial location or "sweet spot", and therefore the slice at the sweet spot most closely approximates a plane perpendicular to the axis. The method further includes the steps of adjusting radio frequency apparatus to different frequencies so that the RF apparatus selectively interacts with nuclei in different, axially spaced slices at different times to elicit and/or receive magnetic resonance signals for such slices. The method further includes the step of varying the currents supplied to the shim coils so as to move the sweet spot and maintain the sweet spot coincident with each slice while the RF apparatus is interacting with that slice. The method may further include the step of applying magnetic field gradients in radial directions so as to spatially encode magnetic resonance signals elicited from each slice. In this case, the method may further include the step of reconstructing an image of a region of the subject from magnetic resonance signals elicited from one or more slices.

DETAILED DESCRIPTION OF THE PREFERRED EMBODIMENTS

Apparatus in accordance with one embodiment of the invention includes a mobile unit 10 incorporating a static field magnet 12 within a cryostat 36, gradient coil assembly 14 and a command and control console 13 all mounted to a common chassis 15. The chassis 15 includes an arm 17 projecting upwardly from the other components and projecting in a forward direction indicated by arrow F in FIG. 1. A mounting socket 19 at the forward end of arm 17 carries a disposable high-intensity focused ultrasound or "HIFU" unit 16. As further explained below, the static field magnet 12 is arranged to provide a suitable magnetic field for magnetic resonance imaging within a magnetic resonance volume 20 disposed forwardly of unit 10, whereas the HIFU unit 16 is arranged to apply ultrasonic energy at selected focal points within an energy application zone 21 intersecting magnetic resonance volume 20. Chassis 15 is mounted on a positioning system 23. The positioning system 23 is supported on a base 25. Base 25 in turn is provided with casters 27. Casters 27 can be extended so that the entire mobile unit 10 and base 25 can be moved across the floor of the room and can be brought into close alignment with a desired region of a patient P lying on a bed 24. Once the unit is roughly aligned with the desired region, the casters may be retracted and the unit may be brought into the desired, more precise alignment using the positioning system 23 as discussed below. Casters 27 may be replaced by slides or air cushion supports. Positioning system 23 includes conventional devices such as hydraulic or pneumatic actuators, screw jacks and rotary movement devices for moving chassis 15 in multiple degrees of freedom including translation in all vertical and horizontal directions and rotation about three orthogonal axes. Positioning system 23 also includes conventional drive components such as servo motors for driving mechanical linkages and pumps for driving hydraulic or pneumatic movement devices. Moreover, the positioning system desirably includes conventional feedback control elements such as potentiometers and optoelectronic encoders for providing signals indicating the relative positions of the movable elements in the positioning system and thereby indicating the position and orientation of the chassis 15. For example, where translational or pivoting movement of the chassis in one degree of freedom is controlled by a screw mechanism, the screw shaft may be provided with a conventional digital encoder for detecting and reporting the positions of the shaft. Control console 13 is linked to a control computer 29. The control computer is also linked through a positioner interface 31 to positioner 23. The positioner interface includes conventional components for converting signals sent by the feedback control components of the positioner into the digital format used by the control computer, and for converting signals from the control computer into driver signals for the positioning system.

Figure 1:
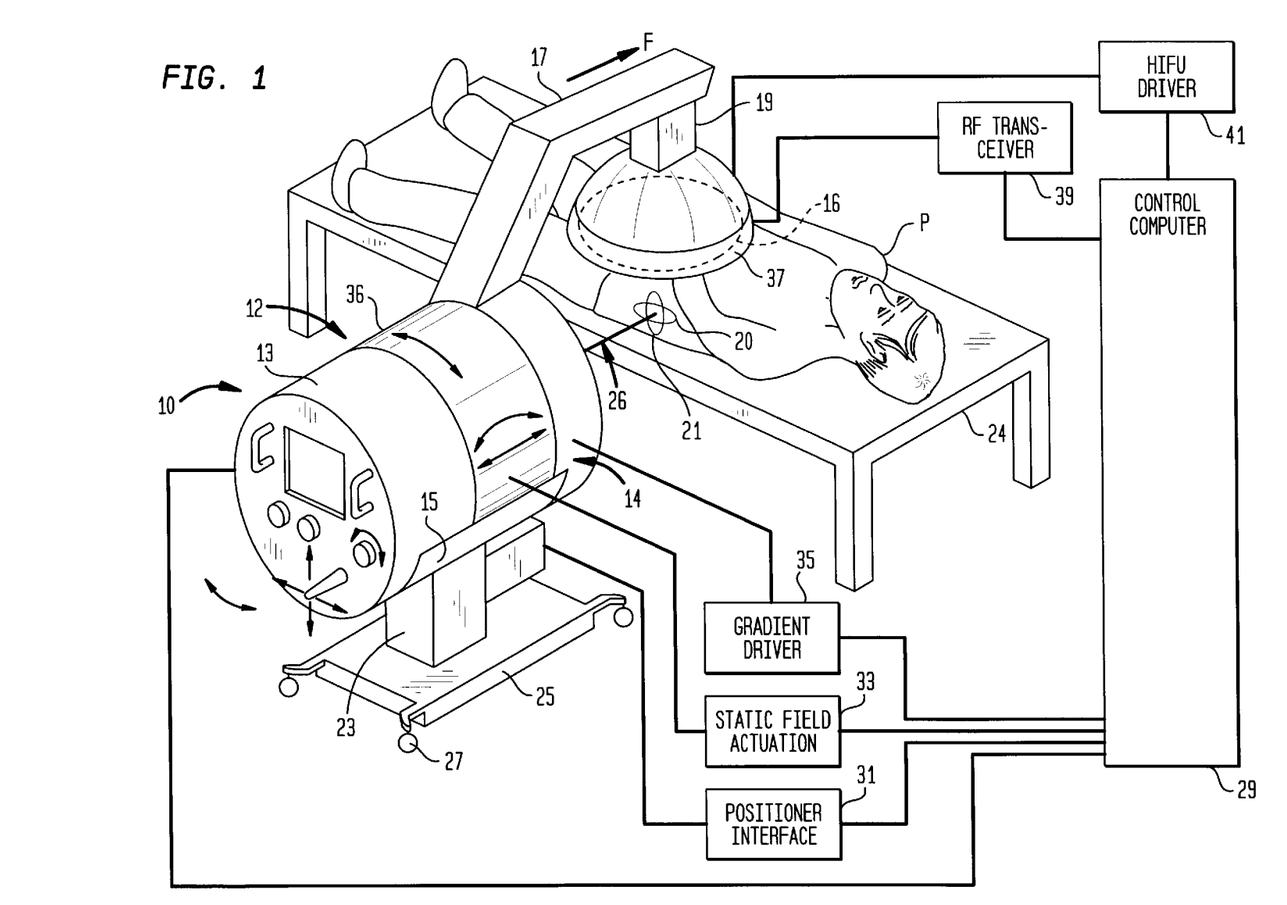
FIG. 1 is a perspective, partially block diagrammatic view depicting apparatus in accordance with one embodiment of the invention.

A static field actuation unit 33 controls the currents in the coils of the static field magnet 12, whereas a gradient driver 35 actuates the gradient coils 14 to impose magnetic field gradients as discussed below. As further discussed below, the static field magnet 12 includes superconducting main field coils and resistive shim coils. The static field actuation unit 33 includes a shim coil driver 136 (FIG. 2) connected to the resistive shim coils. A radio frequency antenna 37 is mounted around the HIFU unit 16 and linked to an RF transceiver 39. The transceiver 39 is also controlled by control computer 29. Further, HIFU driver 41 is connected to HIFU unit 16. Driver 41 is also controlled by control computer 29. As further discussed below, these components cooperate to perform magnetic resonance imaging within magnetic resonance volume 20 and to apply ultrasonic energy at selected points in energy application volume 21.

Figure 2:
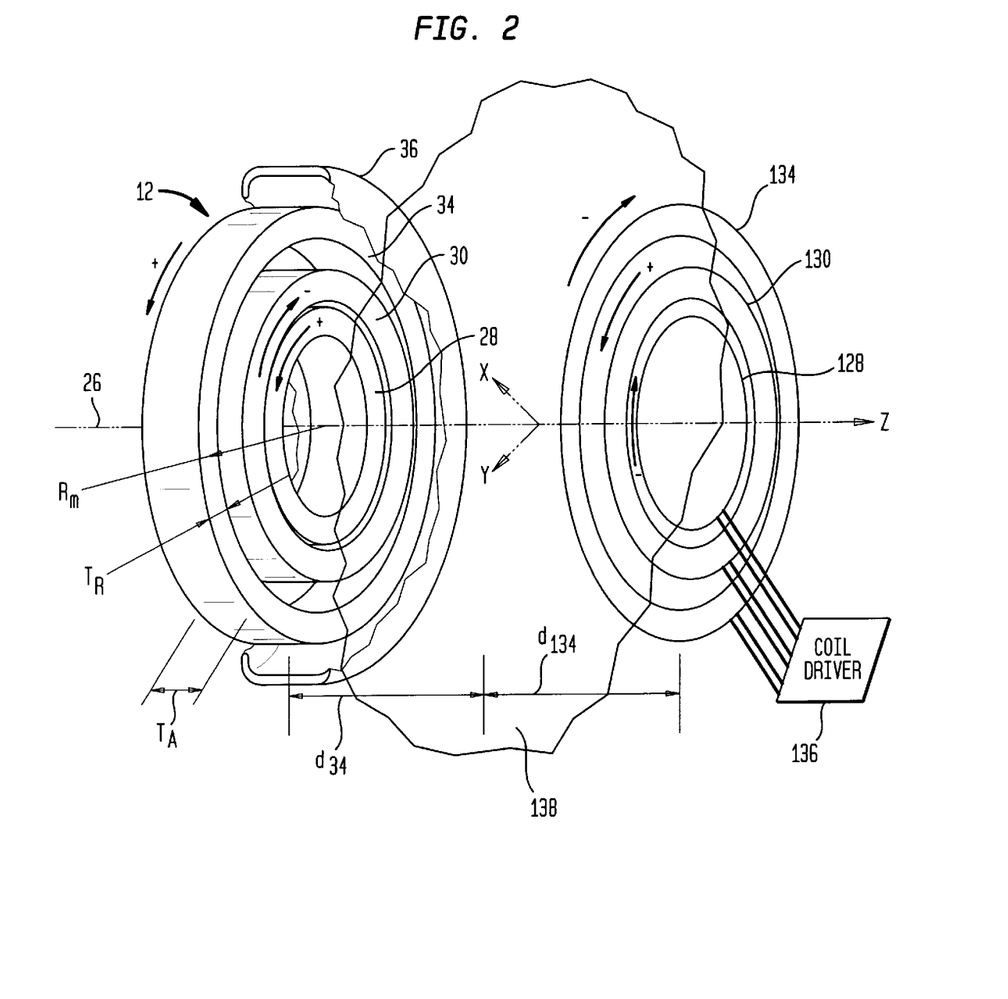
FIG. 2 is a diagrammatic perspective view depicting portions of a magnet incorporated in the apparatus of FIG. 1.

As best seen in FIG. 2, static field magnet assembly 12 includes a plurality of cylindrical superconductive main field coils concentric with a central axis 26. The main field coils include an inner coil 28; middle coil 30; and outer coil 34 arranged concentrically with one another. Coil 34 has an axial thickness $T_a$, a mean radius $R_m$, and a radial thickness $T_{IS}$, and coils 30 and 28 have corresponding dimensions. A toroidal cryostat 36 encloses these coils. Cryostat 36 defines an interior bore 38 extending through the innermost coil 28 and encompassing axis 26. Cryostat 36 is formed as a toroidal shell of a non-ferromagnetic material. The cryostat contains a coolant such as liquid helium or liquid nitrogen for maintaining the coils at superconducting temperatures. In a known manner, the coils are supported within the cryostat by internal supports (not shown). Although the wall of the cryostat is illustrated as a simple wall, in actual practice the cryostat desirably has one or more multiple wall structures with evacuated spaces between the walls. Such a structure is also referred to as a Dewar vessel and minimizes heat conduction to the contents of the cryostat, including the coils and the coolant. Alternatively, the cryostat may be an insulated enclosure which is cooled by means other than cryogenic fluids, such as by thermoelectric cooling or other conventional refrigeration systems. These systems can be used with high $T_c$, superconductors. The superconducting main field coils typically operate at constant current. Thus, when the unit is placed in operation currents are started in the main field coils, by a main field actuator unit 33 (FIG. 1). These currents continue to flow in the main field coils.

The static field magnet further includes a set of shim coils including an inner shim coil 128, a middle shim coil 130 and an outer shim coil 134 concentric with central axis 26 and hence coaxial with the main field coils 28, 30 and 34. Each shim coil corresponds to one of the main field coils, and each shim coil has the same mean radius as the corresponding main field coil. Thus inner shim coil 128 has the same mean radius as inner main field coil 28; middle shim coil 130 has the same mean radius as middle main field coil; and outer shim coil 134 has the same mean radius as outer main coil 34. The shim coils and main field coils lie on opposite sides of a plane of symmetry 138 perpendicular to axis 26. The corresponding main field coils and shim coils are mirror-symmetric about plane 138, so that each shim coil lies at the same axial distance from plane 138 as the corresponding main field coil. For example, the axial distance $d_{134}$ between plane 138 and the center of outer shim coil 134 is equal in magnitude to the distance $d_{34}$ between plane 138 and the center of the corresponding outer main coil 34. The shim coils are resistive coils, and are connected to shim coil driver 136. The shim coil driver includes conventional adjustable current-regulated power supplies linked to the individual coils. The shim coil driver is arranged to adjust the currents passing through the shim coils in response to commands from computer 29.

The directions of current flow in the various coils are denoted as "positive" or "negative" as indicated by the arrows in FIG. 2. These arbitrarily-selected directions of current flow are opposite to one another.

Figure 3:
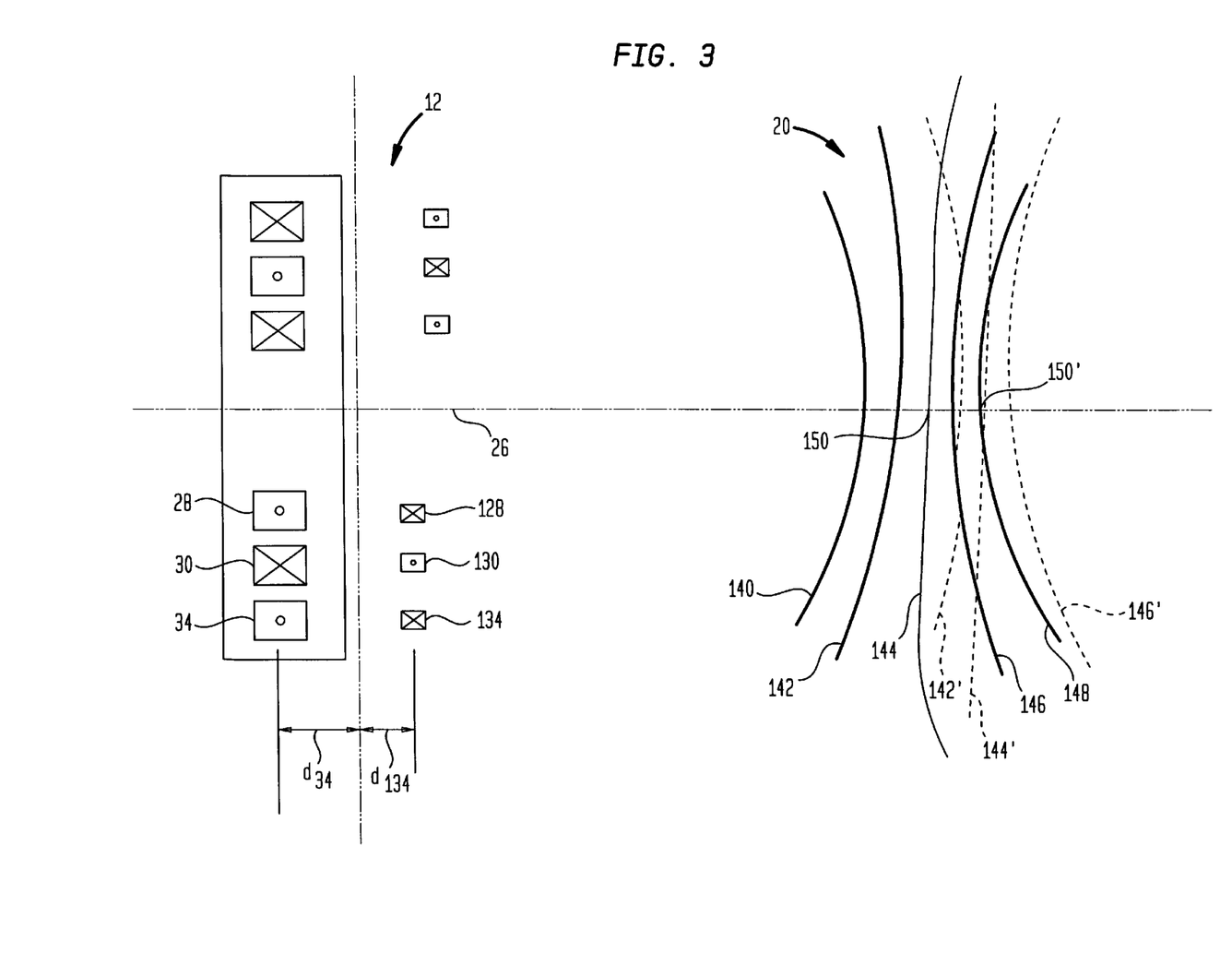
FIG. 3 is a diagrammatic view depicting the magnet of FIG. 2 in conjunction with surfaces of constant field magnitude.

The dimensions of the main field coils for one exemplary embodiment using three main field coils as shown in FIGS. 1, 2 and 3 are set forth in Table I below.

TABLE I

| Mail Coil | Current Sense | Ampere Turns | Axial Thickness $T_a$ (cm) | Mean Radius $R_m$ (cm) | Radial Thickness $T_r$ (cm) |
|---|---|---|---|---|---|
| Inner (28) | Positive | 1,142,460, | 13.92 | 10.51 | 5.3 |
| Middle (30) | Negative | 1,298,088 | 13.92 | 24.6 | 6.0 |
| Outer (34) | Positive | 873,576 | 13.92 | 36.70 | 5.0 |

The main field magnet operated alone, with no current in the shim coils, provides a field of approximately 1 kilogauss with a relatively small linear axial field gradient $$\frac{dB}{dZ}$$

within a region about 5 cm in diameter at an axial distance z of about 25–30 cm from of the front face of the main field coils. In this same region, the radial field curvature $$\frac{d^2B}{dX^2}$$

is also relatively small and hence the field gradient in the radial direction is also relatively small.

The magnet is relatively small; the main field coils of the magnet can be accommodated in a cylinder approximately 78 cm in diameter and only about 14 cm thick. The small dimensions of the magnet dramatically reduce the cost and weight of the cryostat, and the cost of operation. Depending upon the materials used for the cryostat, the entire magnet may have a mass of less than about 500 kg and hence can be moved and positioned relative to the patient by a positioning device 23 of reasonable size.

Operation of the system is schematically depicted in FIG. 3. With the main field coils 28, 30 and 34 of static field magnet 12 operational and with shim coils 128, 130 and 134 inactive, the static field magnet produces a field with a relatively small, linear Z-direction gradient in imaging region 20. Therefore, surfaces 140 through 148 intercepting the central axis 26 at different locations long axis 26 will have different field magnitudes. The radial field curvature $$\frac{d^2B}{dX^2}$$

is low but not zero at the axial intercepts of surfaces 140, 142, 146 and 148. Therefore, these surfaces of constant field magnitude are bowed in axial directions; they are not flat planes. However, at the "sweet spot" 150, the radial field curvature most closely approximates zero. Therefore, surface of constant field magnitude 144 which intercepts axis 26 at spot 150 closely approximates a flat plane perpendicular to the axis.

With shim coils 128, 130 and 134 carrying currents of particular magnitudes counterdirectional to the currents flowing in the corresponding main field coils 28, 30 and 34, the field includes surfaces of constant field magnitude 142', 144', 146' seen in broken lines in FIG. 3. Here again, the field has a gradient in the Z-direction so that surfaces of constant field magnitude intercept the axis 26 at spaced apart locations. However, the "sweet spot" or location where the radial field curvature is at a minimum is shifted to a new location 150', axially offset from the original sweet spot 150. Thus, surface 144', which cuts axis 26 at sweet spot 150' closely approximates a plane, at least in the neighborhood of axis 26, whereas the other surface of constantly magnitude 142' and 146' are bowed to a greater degree. The amount of axial displacement of the sweet spot, and the direction of such displacement, depend upon the magnitudes and directions of the currents in the shim coils. Therefore, by applying appropriate sets of currents in shim coil 128, 130 and 134, the sweet spot or axial location of the flattest slice can be adjusted to the front locations within the imaging region 20. For example, with shim coils 128, 130 and 134 carrying 10,600 12,000, and 10,000 ampereturns, respectively, the sweet spot is displaced about 12 mm axially from the sweet spot with zero shim coil current. Preferably, control computer 29 stores sets of current values corresponding to preselected locations of the sweet spot. To image a particular slice within the subject, control computer 29 actuates the shim coil driver to supply the appropriate currents so as to position the sweet spot at the axial location of that slice. The control computer also tunes the RF transceiver 39 to the particular frequency associated with the field magnitude although the slice intercepting the sweet spot. For example, to image the slice of the subject corresponding to surface 144', the control computer actuates the shim coils to produce the field depicted in broken lines in FIG. 3 and tunes the RF transceiver to the frequency associated with slice 144'. While maintaining the static field magnet at this setting, the control computer actuates gradient drive 35 to operate the gradient coils and apply field gradients in the radial X and Y directions, perpendicular to axis 26. The control computer also actuates transceiver 39 to apply RF pulses and receive the resulting magnetic resonance signals in the conventional manner. The series of RF transmission and reception and X and Y gradient application is referred to as a "sequence". This "sequence" is repeated using different values for one or more gradients during each repetition, to elicit spatially encoded magnetic resonance signals from slice 144'. The magnetic resonance signals resulting from these repetitions together provide sufficient information to reconstruct a magnetic resonance image of the selected slice. This process is then repeated using a different set of shim current settings to position the sweet spot at a different axial location, and with RF transceiver 39 set to a different frequency so as to selectively interact with the slice intercepting this different sweet spot. The shim coil currents are set to position the sweet spot at different axial locations and the slice selection achieved by tuning the RF transceiver is coordinated with the setting so that in each case the selected slice passes through the sweet spot set by the shim coil current. Thus, the system can acquire images of a plurality of planar or nearly-planar slices offset from one another in the axial direction. This capability is achieved with a "single sided" static field magnet system, in which all components of the static field magnet are disposed on one side of the subject.

Numerous variations and combinations of the features discussed above can be utilized without departing from the present invention. For example, using certain types of pulse sequences, it is desirable to intersperse the repetitions of the pulse sequence for various slices with one another. Thus, the set RF application pulses for all of the various slices may be applied sequentially, followed by a set of RF reception intervals for all the various slices. In such an interspersed pulse sequence arrangement, the RF transceiver is tuned to interact with each slice during the RF transmission and reception intervals associated with that slice. The shim coils are adjusted to the settings associated with each slice during the RF transmission and reception intervals associated with that slice.

The particular arrangement of main field coils and shim coils depicted in FIGS. 1–3 is merely illustrative. Thus, other coil placements may be employed. It is not essential that the shim coils be mirror symmetric with the main field coils. In the embodiments discussed above, the main field coils and shim coils interact to produce a slice or surface of constant field magnitude which is planar or nearly planar at the sweet spot. This arrangement is most preferred. However, the invention can be applied where the desired slice shape is non-planar. For example, the desired slice shape may be a parabola of known configuration. The coils may be actuated with various shim coil currents so as to provide fields with parabolic slices of the preselected configuration intercepting the axis at different sweet spots. Thus, the image can be taken using slices of the same configuration at different axial locations, so that the distortion introduced by field curvature will be the same for all slices in the image. Such constant distortion can be corrected in image processing more readily than the unequal distortion in different slices which arises without use of the shim coils.

In the embodiments discussed above, the RF transceiver is tuned to interact with only the best or flattest slice in each field. However, the method can be varied so that the RF transmission and reception apparatus is tuned to interact with other slices of each field. For example, the RF transceiver may be tuned to two different frequencies in sequence to interact selectively with slice 142 and slice 144 of the field depicted in solid lines in FIG. 3. The RF transceiver may be similarly tuned to two different frequencies in sequence to interact with slices 144' and 146' of the field depicted in broken lines. Thus, the transceiver is tuned to interact with one or more additional slices in addition to the best slice of each field. This approach sacrifices some of the field flatness achieved by using only the best slice, but reduces the number of different fields and hence the number of different shim coil current settings required. Reducing the number of changes in shim coil currents can reduce the effects of eddy currents.

Because these and other variations and combinations of the features discussed above can be utilized, the foregoing description of the preferred embodiment should be taken as illustrative rather than as limiting the invention. The invention is further illustrated by the claims set forth below.

What is claimed is:

1. A method of magnetic resonance imaging comprising the steps of:
   (a) positioning a subject adjacent a single-sided static field magnet;
   (b) actuating said static field magnet to provide a plurality of different magnetic fields at different times within an imaging region of the subject, each such field defining a plurality of slices of constant field magnitude including a best slice most closely approximating a preselected shape intersecting an axis, the best slices of said different fields intercepting the axis at different locations;
   (c) tuning RF transmission and reception apparatus to apply RF excitation to the subject so as to elicit and receive magnetic resonance signals selectively from one or more slices defined by each field in the vicinity of the best slice defined by such field; and
   (d) applying magnetic field gradients in directions perpendicular to the axis so as to spatially encode the magnetic resonance signals from each slice.

2. A method as claimed in claim 1 wherein said preselected shape is a plane perpendicular to the axis.

3. A method as claimed in claim 1 wherein said tuning step is selected so that magnetic resonance signals are elicited and received from only the best slice defined by such field.

4. A method as claimed in claim 1 wherein said single-sided static field magnet includes a plurality of axially-symmetric main field coils and one or more axially-symmetric shim coils.

5. A method as claimed in claim 4 wherein said step of actuating said static field magnet includes the steps of maintaining constant currents in said main field coils and applying different currents in said shim coils to produce said different fields.

6. A method as claimed in claim 5 wherein said main field coils are superconducting coils.

7. A method as claimed in claim 5 wherein said shim coils are equal in number to said main field coils so that each shim coil is associated with a corresponding main field coil.

8. A method as claimed in claim 7 wherein each shim coil is of equal mean radius with the corresponding main field coil, and said step of applying different currents in said shim coils includes the step of applying a current in each shim coil in a direction opposite to the direction of current flow in the corresponding main field coil.

9. A method as claimed in claim 4 wherein said shim coils produce a field component having radial curvature opposite to the radial curvature of the field provided by the main field coils in said imaging region.

10. Magnetic resonance imaging apparatus comprising:
    (a) a single-sided main field magnet arranged to provide a main magnetic field defining a plurality of slices of constant field magnitude including a best slice most closely approximating a preselected shape intersecting at axis at a sweet spot outside of a main field magnet;
    (b) one or more shim coils;
    (c) a shim coil driver arranged to actuate said shim coils to provide one or more shim fields such that a resultant field produced by superposition of each shim field and the main field has a best slice which most closely approximates the preselected shape at a sweet spot or location along the axis different from the axial location of the sweet spot of the main field alone.

11. Apparatus as claimed in claim 10 wherein the field at the sweet spot of each said resultant field has a minimum radial curvature and hence the slice at the sweet spot most closely approximates a plane.

12. Apparatus as claimed in claim 11 wherein the shim coils and the currents applied by the shim coil drivers are arranged to produce a field having radial curvature which is opposite to the radial curvature of the main field in the region surrounding the sweet spot of the main field coils.

13. Apparatus as claimed in claim 11 wherein said main field coils and said shim coils are axially symmetric, and wherein the shim coils are coaxial with the main field coils.

14. Apparatus as claimed in claim 13 wherein each shim coil corresponds to one main field coil, and wherein said shim coil driver is arranged to drive each shim coil with a current of the opposite sense to the current in the corresponding main field coil.

15. Apparatus as claimed in claim 14 wherein the shim coils are mirror symmetric with the main field coils about a plane of symmetry perpendicular to the axis, so that each shim coil has the same mean radius as the corresponding main field coil and the distance from the plane of symmetry to each shim coil is equal in magnitude but opposite in direction to the distance between the shim coil and the corresponding main field coil.

16. Apparatus as claimed in claim 10 wherein said shim coil driver is operative to energize said shim coils to provide a plurality of different shim fields to thereby provide a plurality of resultant fields having sweet spots at different axial locations at different times.

17. Apparatus as claimed in claim 16 further comprising RF transmission and reception means for applying RF excitation signals to a subject disposed adjacent the magnet so as to elicit and receive magnetic resonance signals selectively from one or more slices defined by each resultant field in the vicinity of the best slice defined by such resultant field.

* * * * *

UNITED STATES PATENT AND TRADEMARK OFFICE
CERTIFICATE OF CORRECTION

PATENT NO. : 6,208,142 B1
DATED : March 27, 2001
INVENTOR(S) : Wagshul

Page 1 of 1

It is certified that error appears in the above-identified patent and that said Letters Patent is hereby corrected as shown below:

<u>Column 6,</u>
Line 25, after "Further," add -- a --.
Line 37, "$T_{15}$" should read -- $T_r$ --.
Line 55, after "$T_c$" delete -- , --.

Signed and Sealed this

Twenty-eighth Day of August, 2001

*Attest:*

*Attesting Officer*

NICHOLAS P. GODICI
*Acting Director of the United States Patent and Trademark Office*